(12) United States Patent
Chen

(10) Patent No.: US 7,872,693 B2
(45) Date of Patent: Jan. 18, 2011

(54) TOUCH SUBSTRATE AND ELECTRO-WETTING DISPLAY DEVICE HAVING TOUCH CONTROL FUNCTION

(75) Inventor: Wen-Hua Chen, Miao-Li (TW)

(73) Assignee: Chimel Innolux Corporation, Miao-Li County (TW)

( * ) Notice: Subject to any disclaimer, the term of this patent is extended or adjusted under 35 U.S.C. 154(b) by 280 days.

(21) Appl. No.: 12/231,806

(22) Filed: Sep. 5, 2008

(65) Prior Publication Data

US 2009/0065781 A1    Mar. 12, 2009

(30) Foreign Application Priority Data

Sep. 7, 2007    (CN) .......................... 2007 1 0077014

(51) Int. Cl.
*G02F 1/1335*    (2006.01)
*G02F 1/13*    (2006.01)

(52) U.S. Cl. ............................................. 349/12; 349/1

(58) Field of Classification Search .................... 349/12
See application file for complete search history.

(56) References Cited

U.S. PATENT DOCUMENTS

| | | | | |
|---|---|---|---|---|
| 5,623,280 A | * | 4/1997 | Akins et al. ................. | 345/104 |
| 2001/0020987 A1 | * | 9/2001 | Ahn et al. ..................... | 349/12 |
| 2006/0221068 A1 | | 10/2006 | Feenstra et al. | |
| 2007/0263306 A1 | | 11/2007 | Hayes et al. | |
| 2009/0027760 A1 | * | 1/2009 | Wang et al. ................. | 359/291 |
| 2009/0051632 A1 | * | 2/2009 | Lee et al. ..................... | 345/84 |
| 2009/0051672 A1 | * | 2/2009 | Chen et al. ................... | 345/175 |
| 2009/0086113 A1 | * | 4/2009 | Ko et al. ....................... | 349/12 |
| 2009/0256818 A1 | * | 10/2009 | Noguchi et al. ............. | 345/174 |
| 2009/0262096 A1 | * | 10/2009 | Teramoto ..................... | 345/174 |
| 2009/0273570 A1 | * | 11/2009 | Degner et al. ............... | 345/173 |
| 2009/0273572 A1 | * | 11/2009 | Edwards et al. ............. | 345/173 |
| 2009/0315858 A1 | * | 12/2009 | Sato et al. .................... | 345/174 |

FOREIGN PATENT DOCUMENTS

JP    2009064444 A    *    3/2009

* cited by examiner

*Primary Examiner*—Rhonda S Peace
(74) *Attorney, Agent, or Firm*—Wei Te Chung

(57) ABSTRACT

A touch substrate includes a transparent substrate having a first surface and a second surface facing the first surface, a plurality of thin film transistor elements disposed on the second surface, and a capacitance touch structure. The capacitance touch structure includes a plurality of parallel first conductive electrodes disposed on the first surface and a plurality of parallel second conductive electrodes disposed on the second surface. The second electrodes cross the first electrodes insulatingly. The first electrodes, the second electrodes and the transparent substrate sandwiched therebetween form a plurality of sensing capacitors.

20 Claims, 8 Drawing Sheets

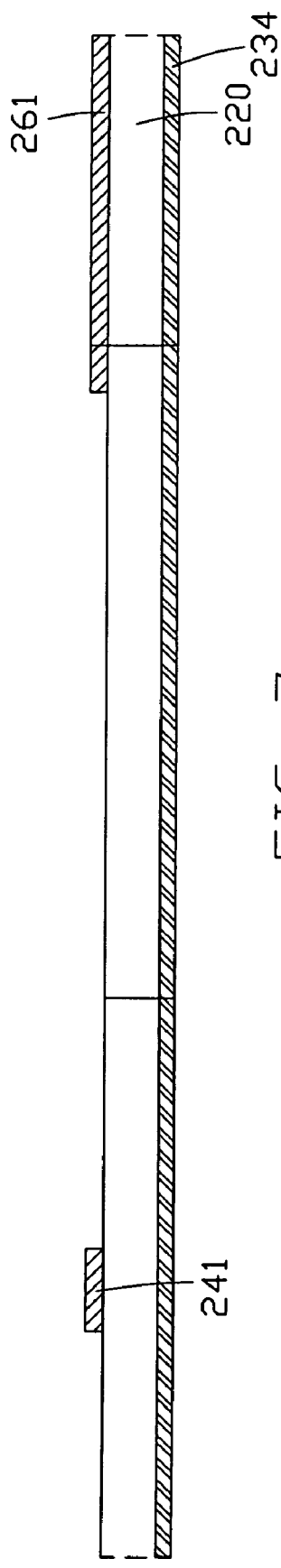
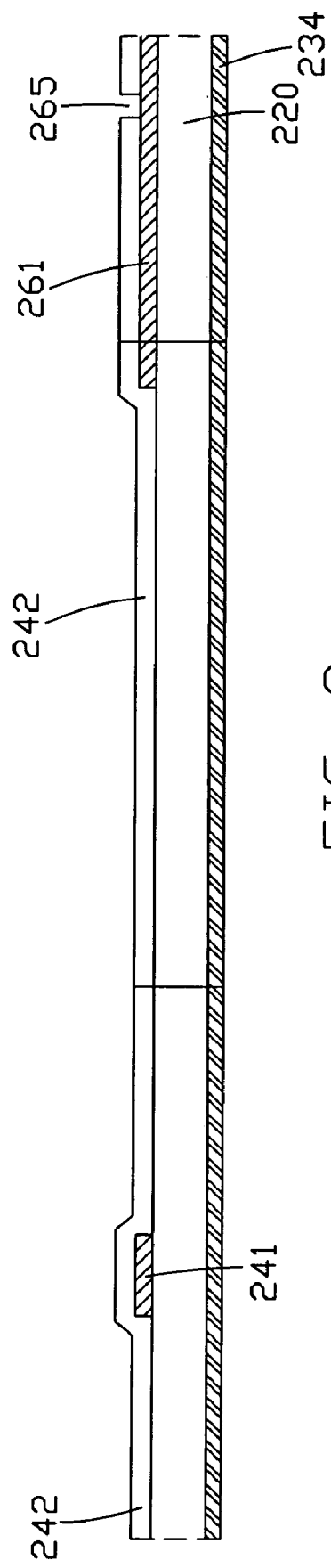

TOUCH SUBSTRATE AND ELECTRO-WETTING DISPLAY DEVICE HAVING TOUCH CONTROL FUNCTION

FIELD OF THE INVENTION

The present invention relates to touch substrate and display devices, and more particularly to an electro-wetting display device having touch control function.

GENERAL BACKGROUND

Nowadays, many optical-electro technologies are rapidly developed and used in next generation of Flat Plate Displays (FPDs) such as Projection Display, Flexible Display and so on. Under the above-mentioned development tendency, a kind of display based on electro-wetting principle is broadly concerned due to its excellent display characteristic just like fast response, wide viewing-angle, and low power-consumption.

Referring to FIG. 12, a side, cross-sectional view of parts of a conventional EWD device 10 under a dark condition is shown. The EWD device 10 includes a first substrate 11, a second substrate 18 opposite to the first substrate 11, a first liquid 13 and a second liquid 12 both provided between the substrates 11, 12, a hydrophobic insulating film 15, a plurality of pixel walls 16, and an active matrix layer 17 disposed on the second substrate 18. The active matrix layer 17 includes a plurality of pixel electrodes 14 and a plurality of TFTs (not shown). The pixel electrodes 14 are arranged in matrix on the second substrate 18, and respectively connected to the TFTs. The hydrophobic insulating film 15 covers the active matrix layer 17. The pixel walls 16 are disposed on the hydrophobic insulating film 15 in a latticed form. Each minimum area surrounded by the pixel walls 16 is defined as a pixel area R, which is located correspondingly to the pixel electrode 14. The first liquid 13 is located between the adjacent pixel walls 16. The material of the first liquid 13 is an opaque oil, such as colored Alkane, Hexadecane or the like. The second liquid 12 is immiscible with the first liquid 13, and filled between the first substrate 11 and the first liquid 13. The material of the second liquid 12 is transparent conductive liquid, such as water, salting liquid, and a solution mixed with Ethyl Alcohol and potassium chloride solution.

When a voltage less than a threshold voltage is applied between the second liquid 12 and pixel electrode 14, the second liquid 12 overlaps with the first liquid 13, and the first liquid 13 smoothly covers the hydrophobic insulating film 15. Incident light is absorbed by the first liquid 13, so that the pixel area R of the EWD device 10 displays a dark condition.

Also referring to FIG. 13, a side, cross-sectional view of parts of the EWD device 10 under a bright condition is shown. When a voltage greater than the threshold voltage is applied, the surface tension of the second liquid 12 is changed. The second liquid 12 pushes the first liquid 13 towards one of the pixel wall 16. Incident light can pass through the second liquid 12, so that the pixel area R of the EWD device 10 displays a bright condition.

However, because touch control technology is widely used, more and more consumers require electronic information devices, just like cell phone, PDA, and ATM, to be installed the touch control function so as to enhancing the interaction between consumer and electronic information devices. But the conventional EWD devices does not have the touch control function yet.

It is, therefore, needed to provide an EWD device that can overcome the above-described deficiencies.

SUMMARY

A touch substrate includes a transparent substrate having a first surface and a second surface facing the first surface, a plurality of thin film transistor elements disposed on the second surface, and a capacitance touch structure. The capacitance touch structure includes a plurality of parallel first conductive electrodes disposed on the first surface and a plurality of parallel second conductive electrodes disposed on the second surface. The second electrodes cross the first electrodes insulatingly. The first electrodes, the second electrodes and the transparent substrate sandwiched therebetween form a plurality of sensing capacitors.

Other novel features and advantages will become more apparent from the following detailed description when taken in conjunction with the accompanying drawings, in which:

BRIEF DESCRIPTION OF THE DRAWINGS

FIG. 7 is a side cross-sectional view relating to a step of turning the transparent substrate over, and form gate electrode and first metallic electrode on the second surface of the transparent substrate of FIG. 6.

FIG. 8 is a side cross-sectional view relating to a step of forming a first connecting hole of FIG. 6.

DETAILED DESCRIPTION OF PREFERRED EMBODIMENTS

Reference will now be made to the drawings to describe preferred and exemplary embodiments of the present invention in detail.

Figure 1:
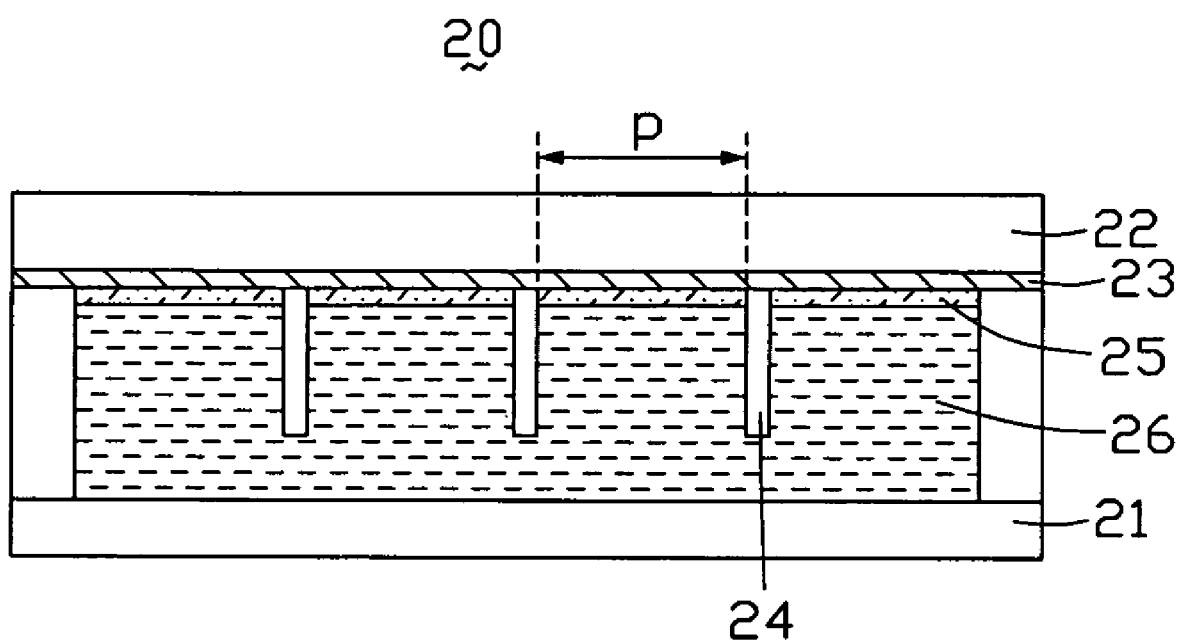
FIG. 1 a side, cross-sectional view of parts of an EWD device according to a preferred embodiment of the present invention, the EWD device including a touch substrate, the touch substrate including a plurality of pixel regions.

Referring to FIG. 1, a side, cross-sectional view of parts of an EWD device 20 according to a preferred embodiment of the present invention is shown. The EWD device 20 includes a transparent holding substrate 21, a touch substrate 22, a hydrophobic insulating film 23, a plurality of pixel walls 24, an opaque first liquid 25, and a transparent second liquid 26. The transparent holding substrate 21 is opposite to the touch substrate 22. The touch substrate 22 includes a touch control unit (not shown) employed to make up to a touch control construction and a controlling element (not shown) employed to control bright condition and dark condition of the EWD device 20. The hydrophobic insulating film 23 covers the surface of the touch substrate 22 facing the transparent holding substrate 21. The hydrophobic insulating film 23 can be made from hydrophobic material, such as amorphous fluoropolymer. The pixel walls 24 are disposed on the hydrophobic insulating film 23 in a latticed form. Each minimum area surrounded by the pixel walls 24 is defined as a pixel region P. The first liquid 25 is evenly received within the pixel region P on the hydrophobic insulating film 23. The first liquid 25 is an opaque oil, and can be made from colored Alkane, Hexadecane or the like. The second liquid 26 is immiscible with the first liquid 25, and filled between the transparent holding substrate 21 and the first liquid 25. The material of the second liquid 26 is transparent conductive liquid, such as water, salting liquid, and a solution mixed with Ethyl Alcohol and potassium chloride solution.

Figure 2:
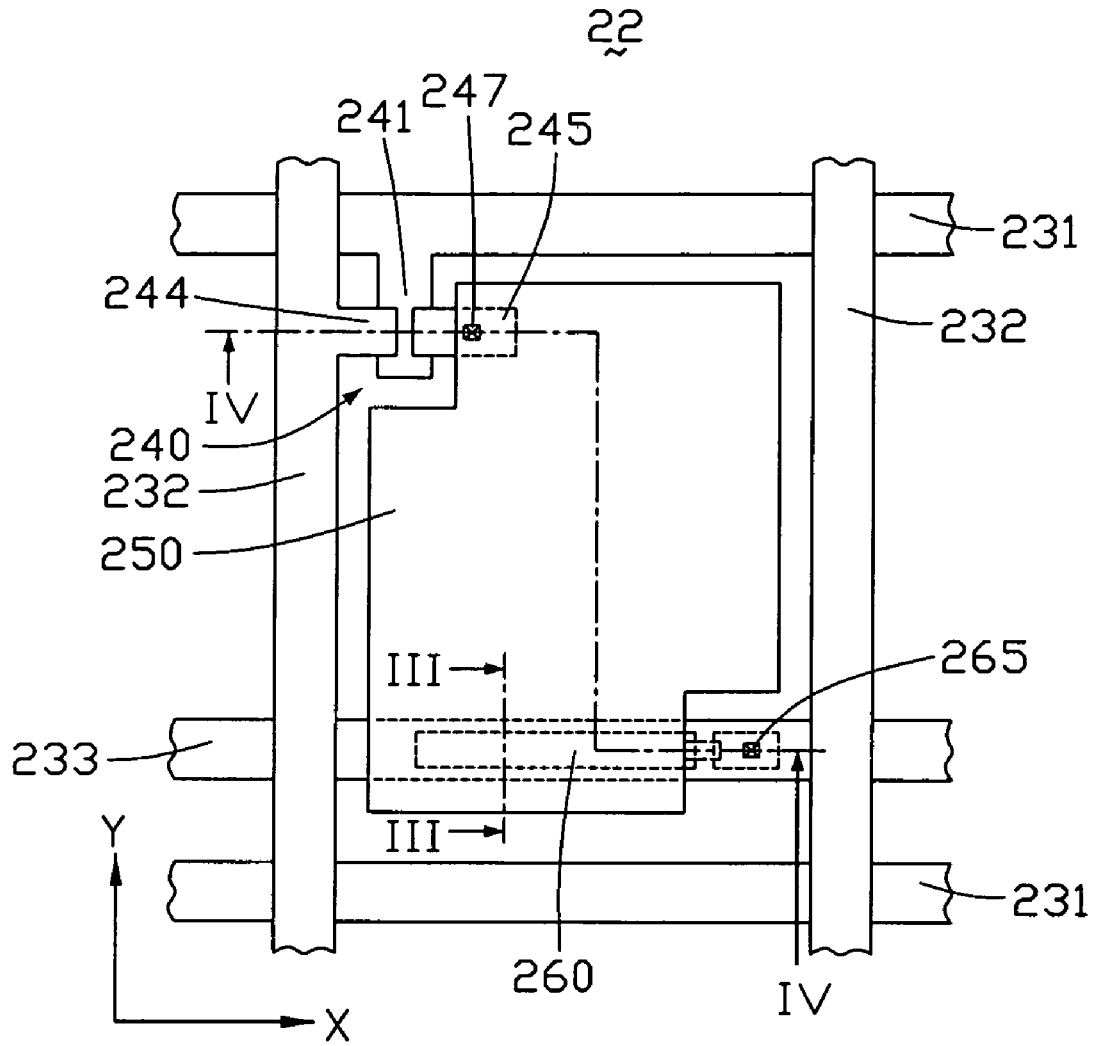
FIG. 2 is a top, plan view of one of the pixel regions of the touch substrate of FIG. 1.
Figure 3:
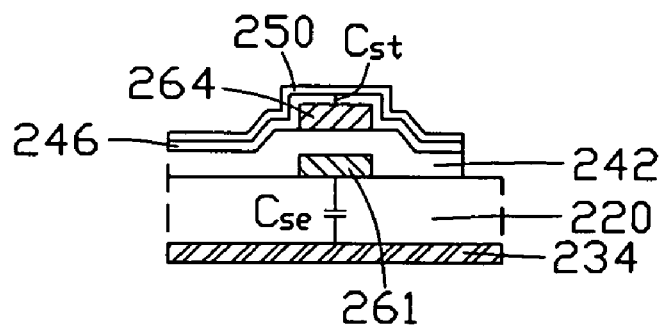
FIG. 3 is a side, cross-sectional view of parts of the EWD device taken along line V-V of FIG. 2.
Figure 4:
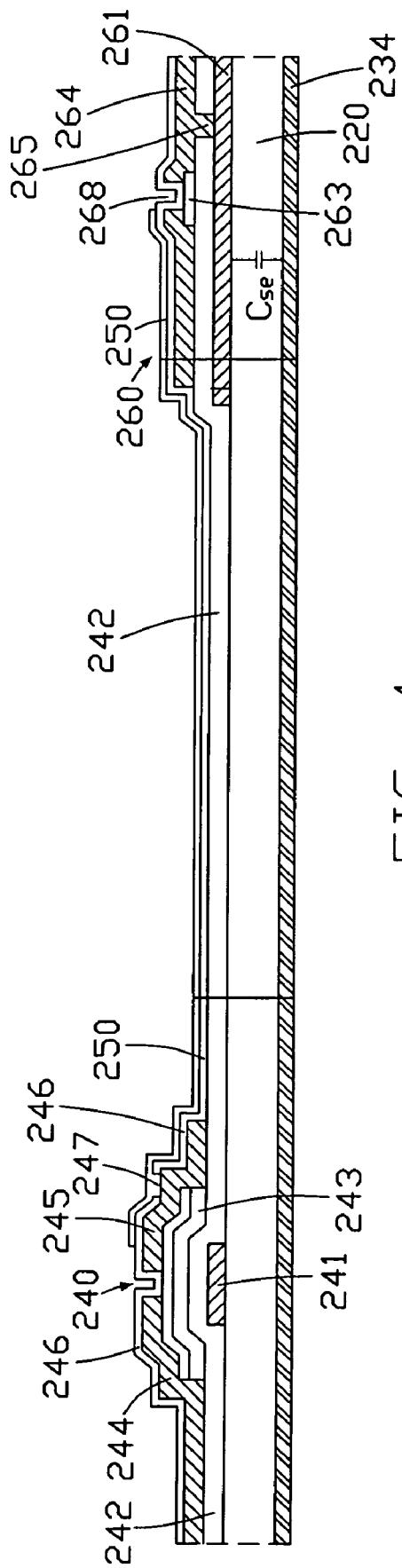
FIG. 4 is a side, cross-sectional view of parts of the EWD device taken along line VI-VI of FIG. 2.

Also referring to FIG. 2, FIG. 3, and FIG. 4, the touch substrate 22 includes a transparent substrate 220, a plurality of scanning lines 231 horizontally arranged on a second surface of the transparent substrate 220, a plurality of data lines 232 crossing the scanning lines 231 insulatingly, a plurality of common lines 233, and a plurality of driving lines 234 disposed on a first surface of the transparent substrate 220. Each of the driving lines 234 is corresponding to one of the common lines 233. The driving lines 234 are employed as first conductive electrodes of the EWD device 20 along a Y direction. The common lines 233 are parallel to each other. Each of the common lines is disposed between two adjacent scanning lines 231. The common lines 233 are also employed as second conductive electrodes of the EWD device 20 along an X direction. The common lines, the driving lines 234, and the transparent substrate 220 form a sensing capacitor Csense. The common lines 233 and the driving lines 234 cooperatively form a capacitor type touch control construction.

Minimum areas defined by the scanning lines 231 and the data lines 232 are corresponding to the pixel region P. Each of the pixel region P includes a thin film transistor (TFT) 240, a pixel electrode 250, a second insulating film 246, and a diode 260.

The TFT 240 is disposed adjacent to intersections of the scanning lines 231 and the data lines 232. The TFT 240 includes a gate electrode 241, a first insulating layer 242, a semi-conductive layer 243, a source electrode 244, and a drain electrode 245. The gate electrode 241 is disposed on the second surface of the transparent substrate 220, and is connected to the scanning line 231. The first insulating layer 242 covers the gate electrodes 241, the common lines 233, and the second surface of the transparent substrate 220. The semi-conductive layer 243 is disposed on the first insulating layer 242. The source electrode 244 and the drain electrode 245 are disposed oppositely on the semi-conductive layer 243. The source electrode 244 is connected to the data lines 232.

The diode 260 is corresponding to the common line 233. The diode 260 includes a first metal electrode 261, a second insulating layer 262, a second semi-conductive layer 263, a second metal electrode 264, and a first connecting hole 265. The first metal electrode 261 is a part of the common line 233. The first metal electrode 261 is covered with the first insulating layer 242. The first insulating layer 242 defines a first connecting hole 265 corresponding to a periphery of the pixel region P. The second metal electrode 264 is disposed on the first insulating layer 242 corresponding to the second metal electrode 264. The second metal electrode 264 is connected to the first metal electrode 261 via the first connecting hole 265.

The second metal electrode 264, the source electrode 244, and the drain electrode 245 can be fabricated in a same process. The second metal electrode 264 defines an opening 268. The second semi-conductive layer 263 is disposed on the first insulating layer 242 corresponding to the opening 268. A part of the second metal electrode 264 around the opening 268 overlaps with the second semi-conductive layer 263, such that an electrical connection is formed between the second metal electrode 264 and the second semi-conductive layer 263. A portion of the second metal electrode 264 connected to the first connecting hole 265 is functioned as an anode of the diode 260, the other portion of the second metal electrode 264 is employed as a cathode of the diode 260.

The second insulating layer 246 covers the TFT 240, the first insulating layer 242, and the diode 260 for protecting the TFT 240 and the diode 260. The second insulating layer 246 defines a second connecting hole 247 therethrough. The second connecting hole 247 is corresponding to the drain electrode 245. The pixel electrode 250 covers the second insulating layer 246 and the cathode of the diode 260. The pixel electrode 250 is connected to the drain electrode 245 via the second connecting hole 247. The pixel electrode 250, the second metal electrode 264, the second insulating layer 262 cooperatively form a storage capacitor Cst.

Figure 5:
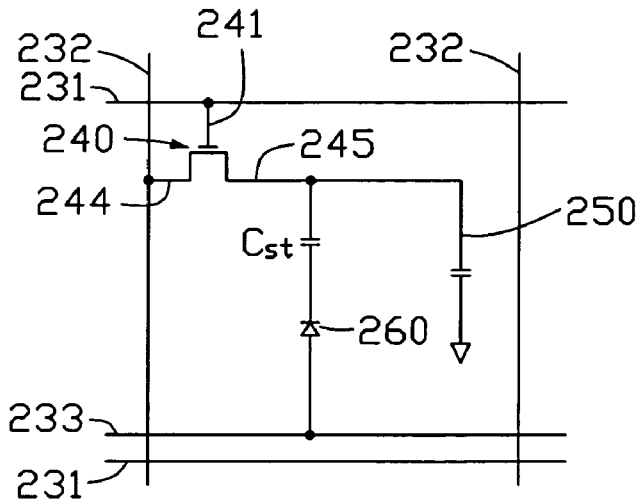
FIG. 5 is an equivalent circuit diagram of the EWD device of FIG. 1.

Referring to FIG. 5, an equivalent circuit diagram of the EWD device 20 is shown. In operations, the second liquid 26 is applied with a common voltage, and the TFT 240 is orderly applied with a canning voltage via the scanning lines 231. When applied with the canning voltage, the TFT 240 is switched on, and a data voltage is applied to pixel electrode 250 via the data line 232 and the TFT 240. When a voltage difference between the pixel electrode 250 and the second liquid 26 is less than a threshold voltage, the first liquid 25 overlap with the second liquid 26. Incident light is completely absorbed by the first liquid 25, such that the EWD device 20 displays a dark image. When the voltage difference between the pixel electrode 250 and the second liquid 26 is greater than the threshold voltage, the second liquid 26 pushes the first liquid 25 towards the TFT 240. Incident light passes though the second liquid 26, such that the EWD device 20 displays a bright image.

Simultaneously, an external controlling circuit (not shown) alternatively scans the common lines 233 and the driving lines 234. When not touched, a capacitance of each sensing capacitor Cse on the touch substrate 22 is maintained at a constant value. But when the touch substrate 22 is touched by a touching unit like a finger, or a touching pen, the touch unit and the capacitor type touch control construction cooperatively form a touch capacitor. The touch capacitor changes the capacitance of some of the sensing capacitors Csenses corresponding to a touching action, thus locating a coordinate of the touching action. When the common lines 233 are being scanned, the diodes 260 are switched on. Signal on the common lines transmits to the storage capacitor Cst to provide a common voltage to the storage capacitors Csts. When the common lines 233 are not scanned, the diodes 260 are switched off, so that the voltage of the storage capacitors Csts won't be changed.

Figure 6:
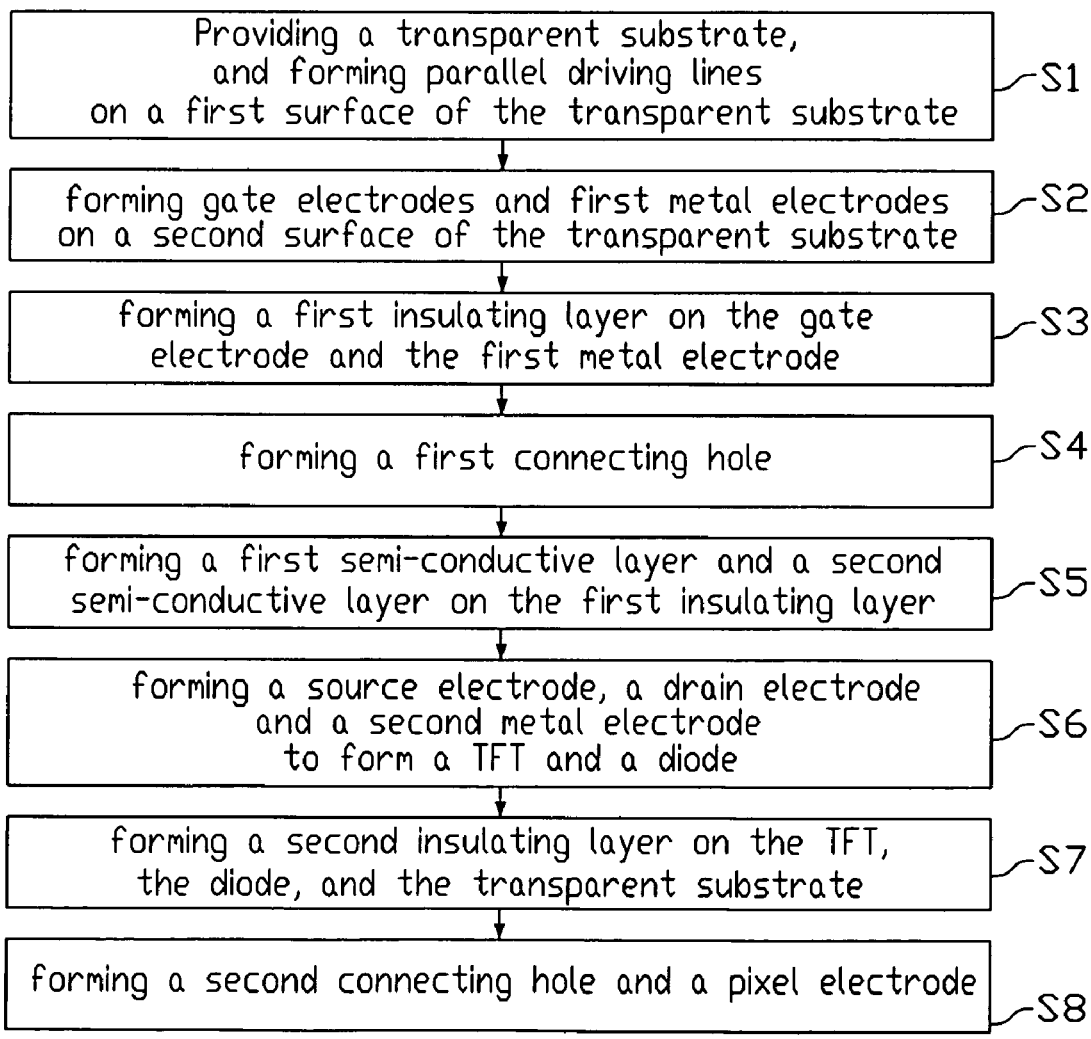
FIG. 6 is a flow chart of a fabricating method of the EWD device of FIG. 1.

Referring to FIG. 6, a flow chart of a fabricating method of the EWD device 20 is shown. The fabricating method of the EWD device 20 includes the following steps: step 1, providing a transparent substrate, and forming parallel driving lines on a first surface of the transparent substrate; step 2, forming the electrodes and first metal electrodes on a second surface of the transparent substrate; step 3, forming a first insulating layer on the gate electrode and the first metal electrode; step 4, forming a first connecting hole; step 5, forming a first semi-conductor layer and a second semi-conductive layer on the first insulating layer; step 6, forming a source electrode, a drain electrode and a second metal electrode to form a TFT and a diode; step 7, forming a second insulating layer on the TFT, the diode, and the transparent substrate; step 8, forming a second connecting hole and a pixel electrode.

In step 1, a transparent substrate 220 is provided. The transparent substrate 220 includes a first surface and a second surface opposite to the first surface. A transparent metal layer is disposed on the first surface of transparent substrate 220 by a coating method or a sputtering method. The driving lines 234 is formed by a first mask processing. The transparent metal layer can be made from indium tin oxide (ITO) or indium zinc oxide (IZO).

In step 2, referring to FIG. 7, the transparent substrate 220 is turned over. A metal layer is deposited on the second surface of the transparent substrate 220. The metal layer is patterned by a second mask processing, thus forming the gate electrode 241 and the first metal electrode 261. The metal layer can be made from molybdenum (Mo), titanium (Ti) or alloy of Mo and Ti.

In step 3, a first insulating layer 242 is deposited on the gate electrode 241 and the first metal electrode 261. The first insulating layer 241 can be made from silicon dioxide ($SiO_2$).

In step 4, referring to FIG. 8, a first connecting hole 265 is formed through the first insulating layer 242, thus exposing a part of the first metal electrode 261.

Figure 9:
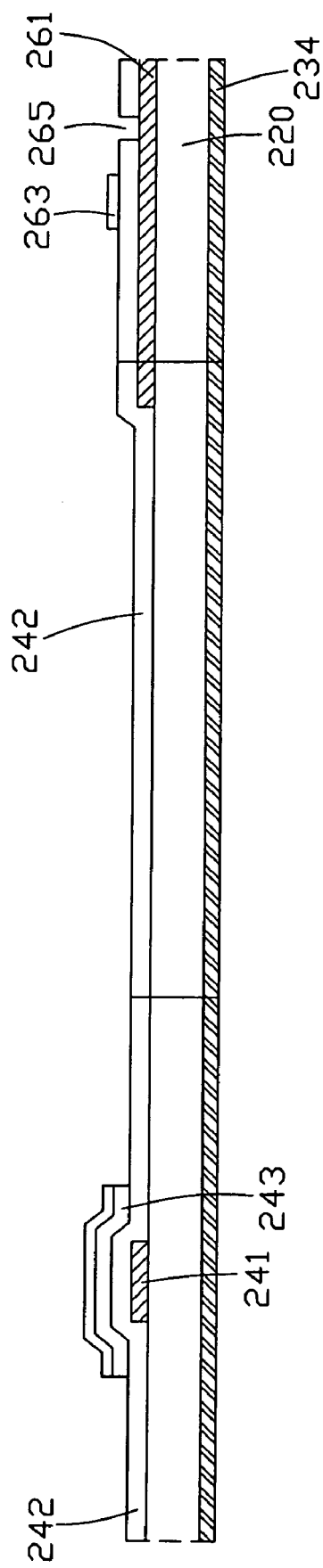
FIG. 9 is a side cross-sectional view relating to a step of forming a first semi-conductive layer and a second semi-conductive layer on the first insulating layer of FIG. 6.

In step 5, referring to FIG. 9, a first semi-conductive layer 243 and a second semi-conductive layer 263 on the first insulating layer. An amorphous silicon film and a N-type amorphous silicon film are deposited on the first insulating layer 242. The amorphous silicon film and the N-type amorphous silicon film are patterned, thus forming the first semi-conductive layer 243 and the second semi-conductive layer 263.

Figure 10:
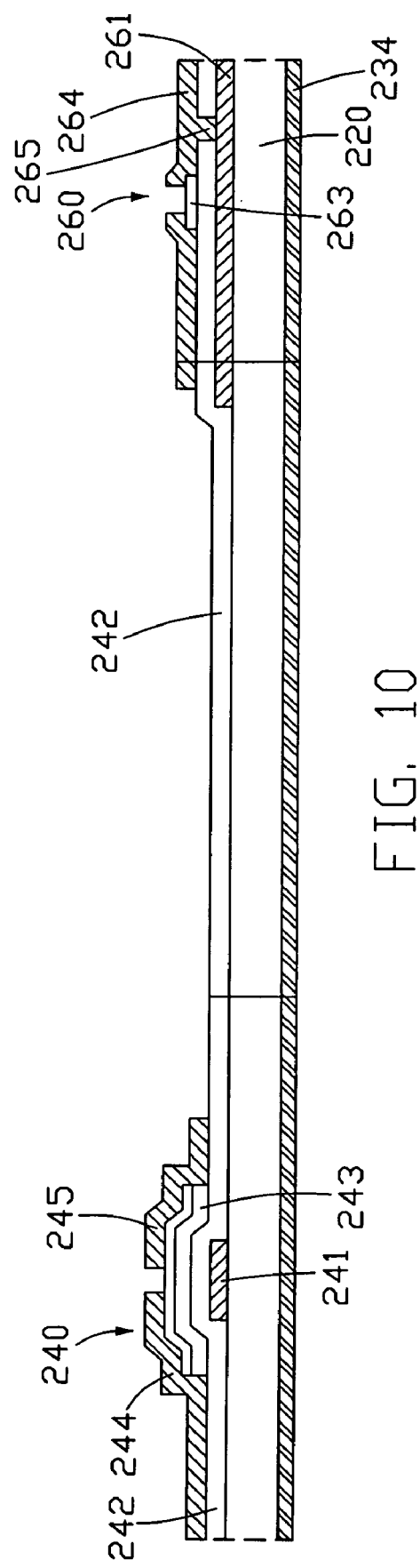
FIG. 10 is a side cross-sectional view relating to a step of forming a source electrode, a drain electrode and a second metal electrode to make a TFT and a diode of FIG. 6.

In step 6, referring to FIG. 10, a second metal layer is deposited on the first semi-conductive layer 243, the second semi-conductive layer 263, the first connecting hole 265, and the transparent substrate 220. The second metal layer is patterned, thus forming the source electrode 244 and the drain electrode 245. The source electrode 244 and the drain electrode 245 partly overlap with the second semi-conductive layer 263, thus forming the TFT 240. The second metal electrode 264 is formed on the second semi-conductive layer 263. The second metal electrode 264 also partly overlaps with the second semi-conductive layer 263, thus forming the diode 260. A source electrode 244, a drain electrode 245 and a second metal electrode 264 are formed, thus forming TFT 240 and a diode 160.

Figure 11:
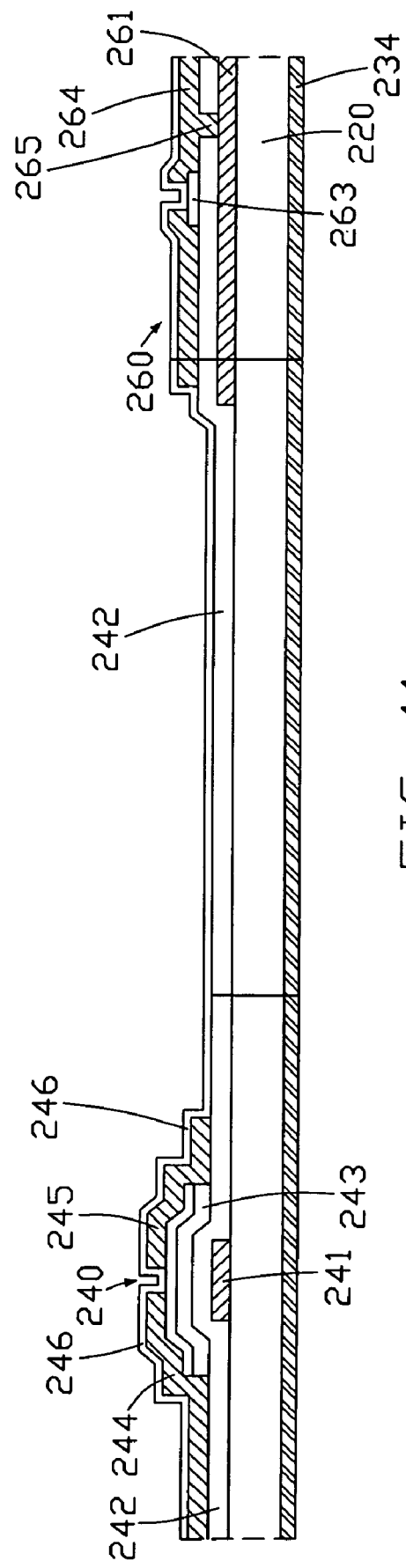
FIG. 11 is a side cross-sectional view relating to a step of forming a second insulating layer covering the TFT, the diode, and the transparent substrate of FIG. 6.
Figure 12:
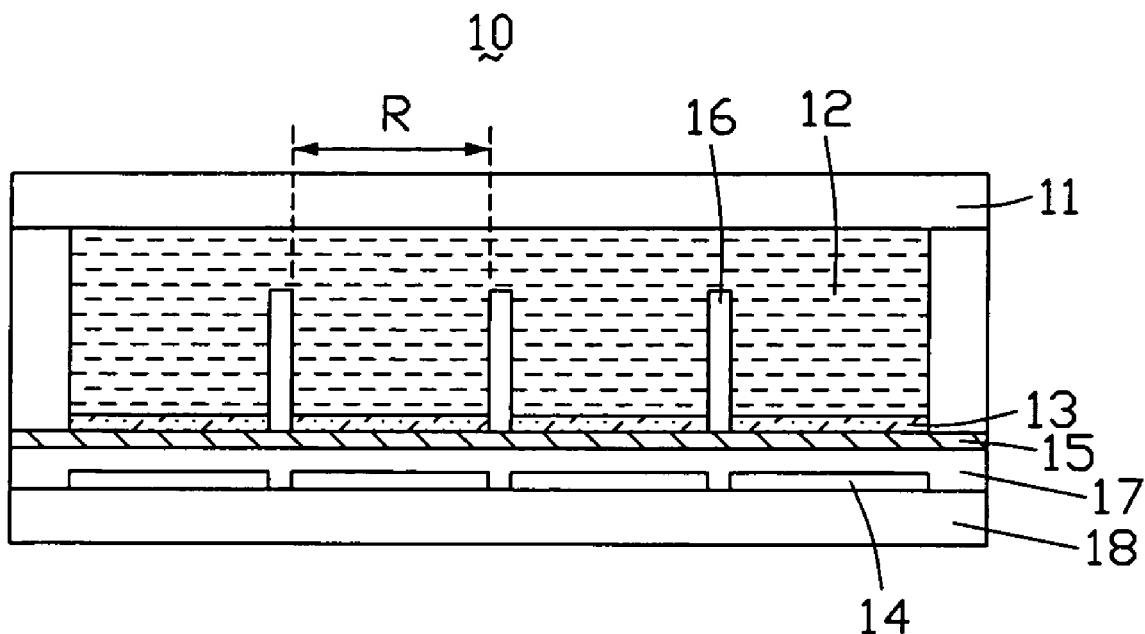
FIG. 12 is a side, cross-sectional view of parts of a conventional EWD device under a dark condition.
Figure 13:
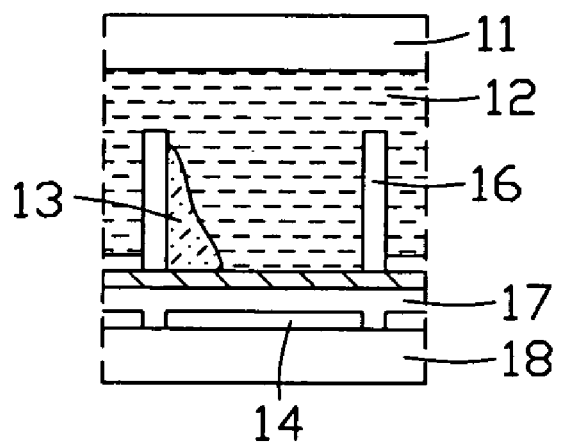
FIG. 13 is a side, cross-sectional view of parts of the EWD device under a bright condition.

In step 7, referring to FIG. 11, a insulating film is formed on the above-mentioned construction. The insulating film is patterned, thus forming the second insulating layer 246 covering the TFT 240, the diode 260, and the transparent substrate 220. The insulating film can be made from amorphous silicon nitride (SiNx).

In step 8, the second insulating layer 246 is patterned, thus forming the second connecting hole 247. A transparent conductive material film is coated and patterned, thus forming the pixel electrode 250. A second connecting hole 247 and a pixel electrode 250 are formed. Therefore, the touch substrate 22 having touch control function is formed, and the EWD device 20 is equipped with touch control function.

It is to be further understood that even though numerous characteristics and advantages of preferred and exemplary embodiments have been set out in the foregoing description, together with details of structures and functions associated with the embodiments, the disclosure is illustrative only, and changes may be made in detail (including in matters of arrangement of parts) within the principles of the invention to the full extent indicated by the broad general meaning of the terms in which the appended claims are expressed.

What is claimed is:

1. A touch substrate comprising:
   a transparent substrate comprising a first surface and a second surface facing the first surface;
   a plurality of thin film transistor elements disposed on the second surface; and
   a capacitance touch structure comprising:
   a plurality of parallel first conductive electrodes disposed on the first surface; and
   a plurality of parallel second conductive electrodes disposed on the second surface, the second electrodes crossing the first electrodes insulatingly, wherein the first electrodes, the second electrodes and the transparent substrate sandwiched therebetween forming a plurality of sensing capacitors.

2. The touch substrate of claim 1, further comprising a plurality of parallel scanning lines and a plurality of parallel data lines disposed on the second surface, the data lines perpendicularly crossing the scanning lines insulatingly, the thin film transistor elements being disposed adjacent to intersections of the scanning lines and the data lines.

3. The touch substrate of claim 2, further comprising a plurality of common lines disposed on the second surface, the common lines and the scanning lines being arranged alternately.

4. The touch substrate of claim 3, wherein the second electrodes are part of the common lines.

5. The touch substrate of claim 2, wherein the first conductive electrodes are disposed corresponding to the data lines.

6. The touch substrate of claim 1, further comprising a plurality of diodes placed on the second conductive electrodes.

7. The touch substrate of claim 6, wherein the diode comprises a first semi-conductor layer and a metal electrode, the metal electrode defining an opening, separated parts of the metal electrode adjacent the opening being electrically connected with each other by the first semi-conductor layer.

8. The touch substrate of claim 7, further comprising a first insulating layer sandwiched between the metal electrode and the second conductive electrode.

9. The touch substrate of claim 8, wherein the first insulating layer defines a connecting hole for connecting the metal electrode and the second conductive electrode.

10. The touch substrate of claim 9, wherein the thin film transistor comprises a gate electrode, a source electrode, a drain electrode and a second semi-conductor layer, the gate electrode being disposed on the second surface, the first insulating layer covering the gate electrode, the second semi-conductor layer being disposed on the first insulating layer corresponding to the gate electrode, the source electrode and the drain electrode overlapping a part of the second semi-conductor layer.

11. The touch substrate of claim 10, further comprising a pixel electrode disposed on a separated part of the metal electrode far from the connecting hole, the pixel electrode being connected with the drain electrode.

12. The touch substrate of claim 11, further comprising a second insulating layer sandwiched between the pixel electrode and the metal electrode.

13. The touch substrate of claim 12, wherein the metal electrode, the pixel electrode, and the second insulating layer form a storage capacitor.

14. A touch electro-wetting display device, comprising:
a touch substrate;
a holding substrate facing the touch substrate;
a hydrophobic insulating layer covering the touch substrate;
a first polar liquid disposed between the holding substrate and the hydrophobic insulating layer;
a second polar liquid disposed between the holding substrate and the first polar liquid, the first second polar liquid and the second polar liquid being immiscible,
wherein the touch substrate comprising:
a transparent substrate comprising a first surface and a second surface facing the first surface;
a plurality of thin film transistor elements disposed on the second surface; and
a capacitance touch structure comprising:
a plurality of parallel first conductive electrodes disposed on the first surface; and
a plurality of parallel second conductive electrodes disposed on the second surface, the second electrodes crossing the first electrodes insulatingly, the first electrodes, the second electrodes and the transparent substrate sandwiched therebetween forming a plurality of sensing capacitors.

15. A touch substrate comprising:
a transparent substrate comprising a first surface and a second surface facing the first surface; and
a plurality of parallel first conductive electrode disposed on the first surface,
the touch substrate defining a plurality of pixel regions, each pixel region comprising:
a common line disposed on the second surface;
at least one first insulating layer; and
a storage capacitor, the common line perpendicularly intersecting with the first conductive line and being placed through the pixel region, the at least one first insulating layer covering the common line,
the storage capacitor comprising:
a first metal electrode disposed on the at least one first insulating layer corresponding to the common line;
at least one second insulating layer covering the first metal electrode; and
a pixel electrode covering the at least one second insulating layer, wherein the common line, the at least one conductive electrode, and the transparent substrate cooperatively forming a sensing capacitor.

16. The touch substrate of claim 15, further comprising a diode disposed corresponding to the common line.

17. The touch substrate of claim 16, wherein the diode comprises a semi-conductor layer and a metal electrode disposed on the common line, the metal electrode defining an opening, separated parts of the metal electrode adjacent the opening being electrically connected with each other via the semi-conductor layer.

18. The touch substrate of claim 17, further comprising a second insulating layer sandwiched between the metal electrode and the common line.

19. The touch substrate of claim 18, wherein the first insulating layer defines a connecting hole for connecting the metal electrode and the common line.

20. The touch substrate of claim 15, wherein the first liquid is non-conductive, and the second liquid is conductive.

* * * * *

UNITED STATES PATENT AND TRADEMARK OFFICE
CERTIFICATE OF CORRECTION

| | | |
|---|---|---|
| PATENT NO. | : 7,872,693 B2 | Page 1 of 1 |
| APPLICATION NO. | : 12/231806 | |
| DATED | : January 18, 2011 | |
| INVENTOR(S) | : Wen-Hua Chen | |

It is certified that error appears in the above-identified patent and that said Letters Patent is hereby corrected as shown below:

Title page replace Item (73) regarding "Assignees" with the following:

(73) Assignees: Chimei Innolux Corporation, Miao-Li County (TW).

Signed and Sealed this
Fourteenth Day of June, 2011

David J. Kappos
*Director of the United States Patent and Trademark Office*